United States Patent
Sihlbom et al.

(10) Patent No.: US 7,535,298 B2
(45) Date of Patent: May 19, 2009

(54) ARRANGEMENT AND A METHOD RELATING TO SIGNAL PREDISTORTION

(75) Inventors: Björn Sihlbom, Frölunda (SE); David Dorbeus, Mölndal (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 100 days.

(21) Appl. No.: 11/575,174

(22) PCT Filed: Sep. 15, 2004

(86) PCT No.: PCT/SE2004/001315

§ 371 (c)(1),
(2), (4) Date: Mar. 13, 2007

(87) PCT Pub. No.: WO2006/031156

PCT Pub. Date: Mar. 23, 2006

(65) Prior Publication Data

US 2008/0074186 A1    Mar. 27, 2008

(51) Int. Cl.
H03F 1/26    (2006.01)
(52) U.S. Cl. .................................. 330/149
(58) Field of Classification Search ............. 330/149; 375/297; 455/114.3
See application file for complete search history.

(56) References Cited

U.S. PATENT DOCUMENTS 6,731,168 B2 * 5/2004 Hedberg et al. ............ 330/149
6,937,669 B2 * 8/2005 Tomerlin et al. ............ 375/297
7,023,273 B2 * 4/2006 Johnson et al. ............. 330/149
7,251,293 B2 * 7/2007 Vella-Coleiro ............. 375/297
2003/0117215 A1   6/2003 O'Flaherty
2005/0157813 A1 * 7/2005 Cope et al. ................. 375/297

FOREIGN PATENT DOCUMENTS

WO    WO 0163752    8/2001

OTHER PUBLICATIONS

3GPP TS 25.104 V5.8.0 (Dec. 2003) 3rd Generation Partnership Project; Technical Specification Group Radio Access Network; Base Station (BS) radio transmission and reception (FDD) (Release 5).
3GPP TS 25.141 V6.6.0 (Jun. 2004) 3rd Generation Partnership Project; Technical Specification Group Radio Access Network; Base Station (BS) conformance testing (FDD) (Release 6).

* cited by examiner

*Primary Examiner*—Steven J Mottola
(74) *Attorney, Agent, or Firm*—Roger S. Burleigh (57) ABSTRACT

The present invention relates to a predistortion signal amplifier arrangement comprising digital predistortion means for predistortion of an input signal, a non-linear power amplifier, a predistortion control arrangement comprising error estimation means for estimating the error produced in the predistorted signal and a predistortion look-up table arrangement, the content in which is updated by the estimation means. The predistortion look-up table arrangement comprises at least two look-up tables, which are updated by said estimation means and said at least two look-up tables have different number of table entries. It further comprises a combiner for combining updated values obtained from said at least two look-up tables into a composite value and said composite value comprises a distortion coefficient which is input to said digital predistortion arrangement for signal predistortion.

32 Claims, 7 Drawing Sheets

Fig. 1
STATE OF THE ART

ARRANGEMENT AND A METHOD RELATING TO SIGNAL PREDISTORTION

FIELD OF THE INVENTION

The present invention relates to a signal predistortion arrangement for predistortion of signals to be amplified in non-linear power amplifiers and to a predistortion signal amplifier arrangement using predistortion look-up table means to correct the distortion in a power amplifier. The invention also relates to a method for predistorting a signal amplified in a non-linear power amplifier.

STATE OF THE ART

Non-linear amplifiers are among others used in radio transmitters in radio base stations in cellular mobile communications networks. There are generally high requirements on the output signals as far as the frequency spectrum is concerned. The requirements are among other specified by standard bodies such as 3GPP (Third Generation Partnership Project) in TS 25.104, TS 25.141.

It is known to use so called Multi Carrier Power Amplifiers (MCPA) to deal with the problems associated with non-linear amplifiers. These systems are based on analog operation in which the error produced in the amplifier is to be found and subtracted from the signal. Such methods are however expensive, above all due to the fact that it is difficult to find the error, i.e. the difference between input and desired output signal, and the resulting output signal including the error.

Further, it is well known to implement so called Digital Pre-Distortion (DPD) methods in which look-up tables (LUT) having a finite length are used. An estimation algorithm is used to update the values (entries) in the LUT table.

Figure 1:
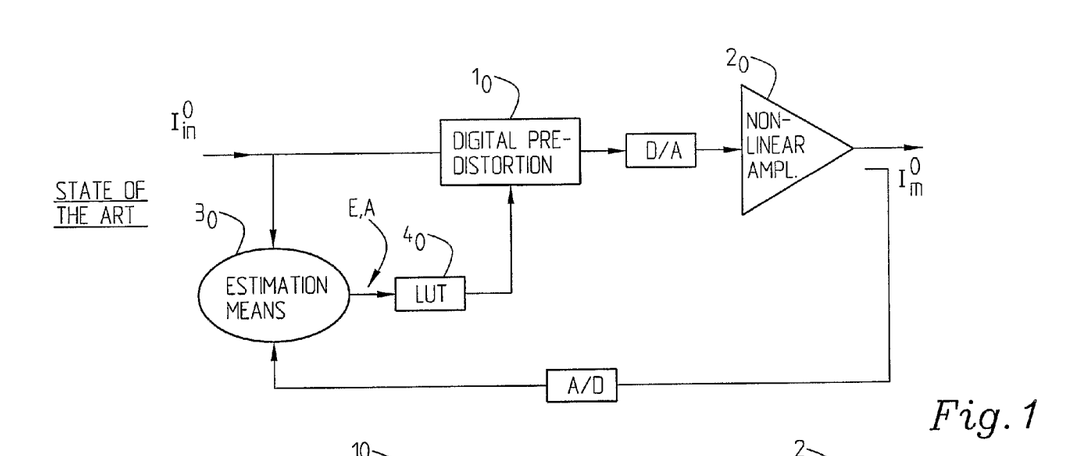

FIG. 1 shows such a prior art arrangement comprising a digital predistortion arrangement $1_0$ in which an input signal $I^0{}_{in}$ is predistorted. The predistorted signal passes a D/A-converter and it is subsequently amplified in the non-linear power amplifier $2_0$. An estimation of the signal output from the power amplifier is performed for feedback as a monitoring signal to estimation means $3_0$ implementing an estimation algorithm to establish the produced error. This is done by comparing the input signal (appropriately delayed) with the monitoring, extracted, signal. The look-up table LUT (look-up tables are in the following simply referred to as LUTs) comprises a given number of table entries, i.e. it has a given resolution, and convergence speed of the estimation algorithm (given a specified noise suppression, i.e. a given feedback loop gain).

It is a problem that normally there has to be a trade-off between LUT resolution and convergence speed of the estimation algorithm. That is, the large number of table entries in the LUT table, the better the resolution and the smaller the resulting final model error, and the fewer the number of table entries, the higher the convergence speed and/or better feedback noise suppression.

Thus, the number of table entries, or the number of bins, of the LUT is crucial. It is difficult to obtain both a fast convergence (requiring a low number of table entries in the LUT) and a low model error (requiring a high number of table entries in the LUT), since these properties are contradictory due to the opposite requirements on the LUT and it inherently has as an effect that the requirements either concerning convergence speed or concerning accuracy to some extent have to be neglected, or can not be met to the desired extent. Often there is a negotiation between the desired properties leading to none of them being satisfactory.

These problems are e.g. encountered in the solution suggested in U.S. 2003 117215 A which shows a closed loop amplifier distortion controller in which phase and amplitude modulator characteristics are adjusted to correct distortion based on feedback of the actual distortion. In the solution suggested therein a look-up table is provided which includes measured values mapped against desired input values for the phase and amplitude modulators to correct the distortion in the power amplifier. The contents in the look-up table is updated by feedback of the actual distortion fed by an error detector subsystem and adaptation.

WO 2001/63752 is another document showing a predistorting circuit for a transmitter power amplifier (PA). It comprises an estimator for determining an estimation signal based on the power of an input signal. A LUT is used to store complex pre-distortion coefficients that depend on the power of the input signal and the non-linear transmission characteristics of a PA, determined in advance. The pre-distorter consists of a multiplication unit, a bypass path provided to multiply the input signal by a constant and a combining unit. Also for this solution the problems referred to above are encountered.

SUMMARY OF THE INVENTION

What is needed is therefore a predistortion signal amplifier arrangement comprising digital predistortion means for predistortion of an input signal, a non-linear power amplifier, a predistortion control arrangement comprising error estimation means for estimating the error produced in the predistorted signal and a predistortion look-up table arrangement, which arrangement provides a good resolution at the same time as it provides a satisfactory, or high, convergence speed of the estimation algorithm. An arrangement as referred to above is also needed which gives a good feedback noise suppression.

Still further an arrangement is needed which is suitable for use in radio transmitters in radio base stations in mobile communication systems, particularly in small, micro, radio base stations, particularly intended for 3G networks.

Moreover an arrangement is needed which allows for accurate and improved controllability of amplitude and phase distortions in a non-linear power amplifier.

Particularly an arrangement is needed which can handle dynamic traffic, i.e. traffic where the input signal characteristics vary considerably both with time, i.e. rapidly, and quantitatively, i.e. high/low power, which is a situation that becomes more and more frequent e.g. within 3G communication networks.

A digital predistortion arrangement comprising digital predistortion means and a predistortion control arrangement with error estimation means for estimating the error produced in the predistorted signal and a predistortion look-up table arrangement is therefore also needed through which one or more of the above mentioned objects can be achieved when it is implemented with a non-linear power amplifier (PA) (or in the non-linear region of a PA), which either may be a specific PA to be used with the arrangement or a conventional or existing, known PA.

Still further a method for predistortion of an input signal is needed through which one or more of the above mentioned objects can be met.

Therefore a predistortion signal amplifier arrangement is provided which comprises digital predistortion means for predistortion of an input signal, a non-linear power amplifier, a predistortion control arrangement comprising error estimation means for estimating the error produced in the predistorted signal and a predistortion look-up table arrangement, the content in which is updated by the estimation means. The predistortion look-up table arrangement comprises at least two look-up tables, which are updated by said estimation means, whereby said at least two look-up tables have different number of table entries, and it further comprises a combiner for combining updated values obtained from said at least two look-up tables into a composite value. Said composite value comprises a distortion coefficient which is input to said digital predistortion arrangement for signal predistortion.

In an advantageous implementation the estimation means comprises an adaptive estimation algorithm and a single estimation process is used for updating all look-up tables. Particularly all of said at least two look-up tables are updated concurrently. Particularly all of said look-up tables are accessed substantially simultaneously, i.e. the estimated error value, for each iteration, is input substantially simultaneously to the appropriate calculated amplitude addresses in the look-up tables to update the entries with said respective addresses in the respective look-up tables. Preferably the estimation means calculates the difference between the input signal and the predistorted signal amplitudes of the preceding iteration step, and address calculating means are provided for calculating the amplitude addresses for the input signal, one address for each look-up table, said amplitude addresses with the corresponding estimated error value being provided to each look-up table.

Preferably will, for each iteration step of a number of steps for controlling the predistortion one, or more, error estimates be provided by the estimation means, and for each error estimation a corresponding look-up table entry amplitude address is calculated. Particularly the calculated amplitude address is the look-up table with the largest number of table entries. According to the invention the look-up tables are hierarchical. In one particular implementation the look-up table with the lowest number of table entries comprises one table entry. It may, however, in other implementations comprise e.g. two or more table entries, but preferably a low number.

According to different implementations the predistortion control arrangement comprises two, three or four look-up tables, but it may also comprise more than four look-up tables. In one specific implementation that has turn out to be advantageous, the predistortion control arrangement comprises three look-up tables, of which a first comprises one table entry, a second comprises four table entries and the third comprises 128 table entries. It should be clear that this merely constitutes one example.

According to the invention the combiner is used for a combining operation to provide a composite value constituting the predistortion coefficient comprising a complex valued composite product or sum in polar coordinates. Alternatively the composite value constituting the distortion coefficient may comprise a complex valued composite product or sum in Cartesian coordinates.

It should be clear that any appropriate combining method can be used.

Particularly the composite distortion coefficient $C_{composite}$ is calculated as the product or the sum of all the updated look-up table entries appropriately time aligned and obtained from the tables using calculated amplitude addresses, $C_{composite} = \pi LUT_n(A_n)$ wherein $A_n = \text{round}(A \times A_{max,n}/A_{max})$ or $\Sigma LUT_n(A_n)$ wherein $A_n = \text{round}(A \times A_{max,n}/A_{max})$ for $n=1, \ldots, N$; N being the number of look-up tables. Particularly each updated table entry comprises the corresponding estimated error adjusted by a table specific, or even more particularly table entry specific, feed-back gain factor (or adjustment factor) $(k_n(A_n))$, $A_n = \text{round}(A \times A_{max,n}/A_{max})$; $n=1, \ldots, N$.

A digital predistortion arrangement for predistortion of an input signal, comprising digital predistortion means, a predistortion control arrangement comprising error estimation means for estimating the error produced in the predistorted signal and a predistortion look-up table arrangement, the content of which is updated by the estimation means is therefore also provided wherein the predistortion look-up table arrangement comprises at least two look-up tables, said at least two look-up tables having different number of table entries, and whereby it further comprises a combiner for combining the updated values obtained from said at least two look-up tables for a calculated amplitude address of the input signal for each look-up table, into a composite value which comprises a distortion coefficient which is input to said digital predistortion arrangement for signal predistortion.

Particularly the estimation means comprises an adaptive estimation algorithm and a single estimation process is used for updating all look-up tables. Even more particularly all of said at least two look-up tables are updated concurrently. Advantageously all of said look-up tables are accessed substantially simultaneously, i.e. the estimated error value, for each iteration, which is input substantially simultaneously to the appropriate calculated amplitude addresses in the look-up tables to update the entries with the respective addresses in the respective tables, the estimation means calculating the difference between the input signal amplitude and the predistorted signal amplitude of the preceding iteration step, whereby address calculating means are provided for calculating the amplitude addresses for the input signals.

In a particular embodiment the predistortion control arrangement comprises three look-up tables, of which a first comprises one table entry, a second comprises four table entries and the third comprises 128 table entries. In a preferred implementation the composite value constituting the distortion coefficient comprises a complex valued composite product or sum in polar coordinates or in Cartesian coordinates. The composite distortion coefficient $C_{composite}$ is even more particularly calculated as the product or sum of all the updated look-up tables entries, appropriately time aligned and obtained using calculated amplitude addresses $A_n = \text{round}(A \times A_{max,n}/A_{max})$, $C_{composite} = \pi LUT_n(A_n)$ or $\Sigma LUT_n(A_n)$ for $n=1, \ldots, N$; N being the number of look-up tables. An arrangement according to the present invention can be used for several implementations. One advantageous use is in a radio base station in a communication system.

Still further a method for predistortion of an input signal, to be amplified in a non-linear power amplifier, comprising the steps of; using a feed-back signal from the amplified signal, and the input signal to provide an error estimate is provided. The method further comprises the steps of; updating one table entry in each of at least two different look-up tables by providing an adjusted error estimate to a corresponding amplitude address of an entry in a look-up table to said at least two look-up tables with a different number of table entries; combining the updated table entries of said at least two look-up tables to provide a composite distortion coefficient; applying the obtained distortion coefficient to the input signal for predistortion; providing the predistorted signal to the power amplifier.

Particularly the error estimation step comprises the steps of implementing an adaptive estimation algorithm whereas the updating step comprises the steps of; calculating an amplitude address using the input signal; calculating the difference between the input signal and the feedback signal and scaling or adjusting the result for the calculated amplitude address in the respective look-up tables with a scaling or adjustment factor coefficient which at least is specific for the respective look-up table; updating, using the calculated amplitude addresses, the look-up tables using the appropriate scaled or adjusted difference estimated error signals.

Preferably the steps for combining the updated table entries comprises the steps of; reading out the respective updated scaled or adjusted difference signals or predistortion values, from the look-up tables with a corresponding amplitude address calculated from the input signal; combining all the read out predistortion values.

Most particularly the updating step is performed, for each look-up table n, n=1, . . . , N by performing a normalizing operation comprising multiplying the calculated address A with the highest address of the respective look-up table n divided by the highest address of the largest look-up table and subtracting, from the hence obtained product, a table specific, or particularly table entry specific, error feed-back gain factor or adjustment factor $k_n (A_n)$ multiplied with the estimated error E; updated $LUT_n(A_n) = LUT_n(A_n) - k_n(A_n) \times E$. The combining step preferably comprises; calculating a complex valued composite product and/or sum in polar or Cartesian coordinates by, multiplying/adding as follows: $\pi LUT_n(A_n)$ or $\rho LUT_n(A_n)$ wherein $A_n = (\text{round}(A \times A_{max,n}/A_{max}))$, n=1, . . . , N.

BRIEF DESCRIPTION OF THE DRAWINGS

The invention will in the following be further described, in a non-limiting manner, and with reference to the accompanying drawings, in which.

DETAILED DESCRIPTION OF THE INVENTION

Figure 2:
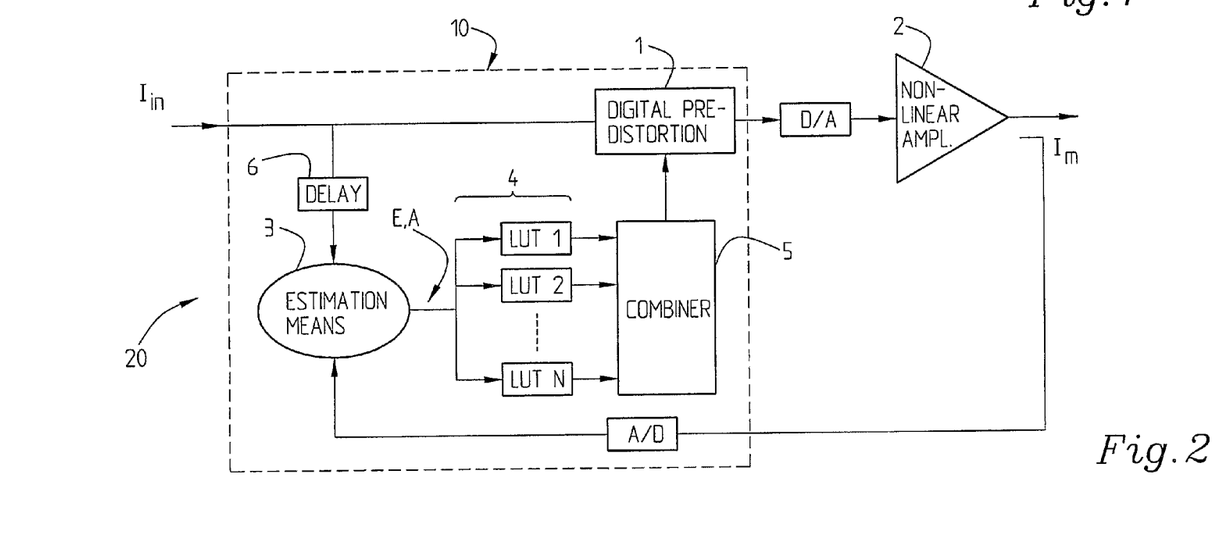
FIG. 2 is a block diagram illustrating a predistortion signal amplifier arrangement according to the invention.

FIG. 2 is a block diagram describing a predistortion signal amplifier arrangement 20 according to one embodiment of the present invention. The predistortion signal amplifier arrangement 20 comprises a digital predistortion arrangement 10 and a non-linear amplifier 2. The digital predistortion arrangement 10 comprises digital predistortion means 1 for predistortion of an input signal $I_{in}$ and a predistortion control arrangement comprising error estimation means 3 for estimating the error produced in a predistorted signal, and a predistortion look-up table arrangement 4 here comprising N look-up tables LUT 1, . . . , LUT N. The N tables of the look-up table arrangement 4 are, for each iteration process or step, updated by the estimation means 3. The corresponding updated table entries, the addresses of which are obtained or calculated from the input signal $I_{in}$ in calculating means (not shown in FIG. 2), in the N tables, are combined in combiner 5 which also is included in the predistortion control arrangement. The respective, substantially simultaneously updated values or table entries in the respective look-up tables LUT 1, . . . , LUT N are combined in combiner 5 to provide a combined or a composite signal $C_{composite}$ which is input to the digital predistortion means 1. The arrangement 20 also comprises a non-linear amplifier 2. Between the digital predistortion means 1 and the non-linear amplifier 2 a D/A-converter is provided to convert the digital signal to an analogue signal. A monitoring signal $I_m$ is extracted from the output from the non-linear amplifier 2, which then is converted in an A/D-converter and input to the estimation means 3. The feedback of the actual distortion is thus provided to the estimation means 3.

The estimation 3 implements an estimation algorithm, and for each iteration, particularly for each input sample, $I_{in}$ appropriately delayed in delay means 6 such as to correspond in time to the feedback, monitoring signal $I_m$. The delayed sample from $I_{in}$ and the corresponding sample $I_m$ are compared in the estimation means giving the difference value between the input signal and the predistorted amplified signal or rather the extracted $I_m$. As referred to above, in FIG. 2 calculating means are used to calculate an amplitude address from the input signal which then is used in the updating procedure when the LUTs are updated by the estimation means. An entry in each LUT is updated using the same error estimate(s) E and the relevant entry of the respective LUT is found using the corresponding calculated address A for the respective LUT. Thus, each LUT is updated as can be seen below:

$$LUT_n(A_n) = LUT_n(A_n) - k_n(A_n)E$$

wherein A is the calculated address at the input signal, and $A_n = \text{round}(A \times A_{max,n}/A_{max})$ n=1, . . . , N, $A_{max,n}$ being the highest address in the respective $LUT_n$ and $A_{max}$ being the highest address in any of the LUTs of the look-up table arrangement 4. $k_n(A_n)$ is an adjustment factor or table entry specific error feedback gain factor which thus is specific for each LUT (entry) in the LUT arrangement which hence is multiplied with the estimated or detected error or difference between the signal samples from the input signal and $I_{in}$ and $I_m$. Advantageously the adjustment factor may also, but not necessarily, be a function of the respective table entry address A.

Thus, after the updating step updated values are provided in each LUT. According to the invention these updated values are combined in LUT combiner 5 to provide a composite distortion coefficient. The address A calculated as referred to above, appropriately time aligned, is used to access LUTs LUTs 1, . . . , LUT N in a manner similar to that described with reference to the updating procedure. A complex valued composite product is then calculated as follows:

$$C_{composite} = \pi LUT_n(A_n), n=1, \ldots, N \text{ and wherein}$$

$$A_n = (\text{round}(A * A_{max,n}/A_{max})$$

The composite product may be expressed in complex valued polar co-ordinates or complex Cartesian co-ordinates.

In an alternative embodiment a complex valued composite sum is calculated in the combiner as:

$$C_{composite} = \Sigma LUT_n(A_n); n=1, \ldots, N \text{ and wherein}$$

$$A_n = (\text{round}(A * A_{max,n}/A_{max})$$

Particularly the estimation algorithm is designed for that look-up table which has the largest number of table entries and all LUTs are updated substantially concurrently by one and the same, single, estimation process. Subsequently, in the application step all LUTs are accessed substantially simultaneously and the values are combined into a composite value which is used for predistortion of the input signal.

In FIG. 2 a general look-up table arrangement 4 is illustrated which contains N LUTs, each with a different number of table entries or bins. Preferably the smallest LUT table has one bin; it is advantageous with e.g. one table entry to provide for a particularly fast convergence. The LUTs can be seen as hierarchical. Different numbers of LUTs can be used as well as different numbers of bins or table entries in the respective LUTs (the number of bins or table entries should however preferably (but not necessarily) differ from each other in each table). It should be clear that the LUT having the lowest number of table entries, or bins, may have more than one table entry, or bin, it may e.g. have two or three table entries (or more) but generally it is preferred if it is a low number, e.g. one or two.

Figure 3:
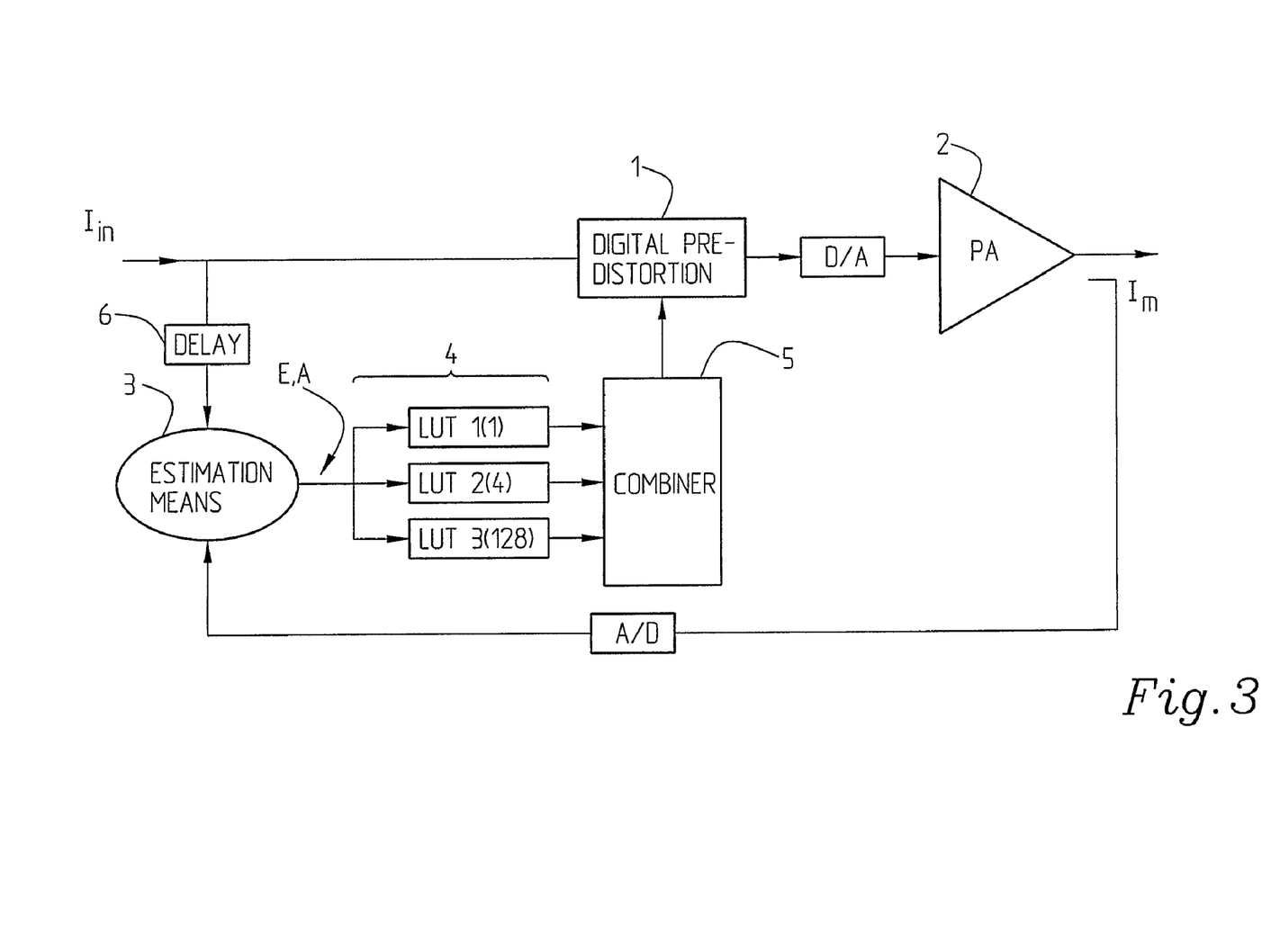
FIG. 3 is a figure similar to FIG. 2 for an implementation with three hierarchical look-up tables.

FIG. 3 shows a block diagram which is similar to that of FIG. 2, with the difference that it specifies a look-up table arrangement 4 comprising three LUTs, namely LUT 1 with one bin or one table entry, LUT 2 with four bins or four table entries and LUT 3 with 128 bins or 128 table entries. In all other respects FIG. 3 is similar to FIG. 2. FIG. 3 shows but one advantageous implementation of the inventive concept and LUT 1, with only one table entry, is used to quickly catch address-invariant gain and phase offsets, whereas LUT 2, with four table entries, is used to quickly catch the basic shape of the non-linear characteristics versus address, whereas finally LUT 3 with 128 bins or 128 table entries is used to obtain the desired resolution. It should be clear that the invention of course not is limited to this specific implementation, there might be two LUTs as well or four or even more LUTs, and the number of entries in the respective LUTs may also vary, for example might LUT 2 (the second LUT) comprise 16 entries and LUT 3 or the third LUT might comprise 64 table entries and or a fourth LUT might comprise 256 table entries etc. Any variation is in principle possible.

Figure 4:
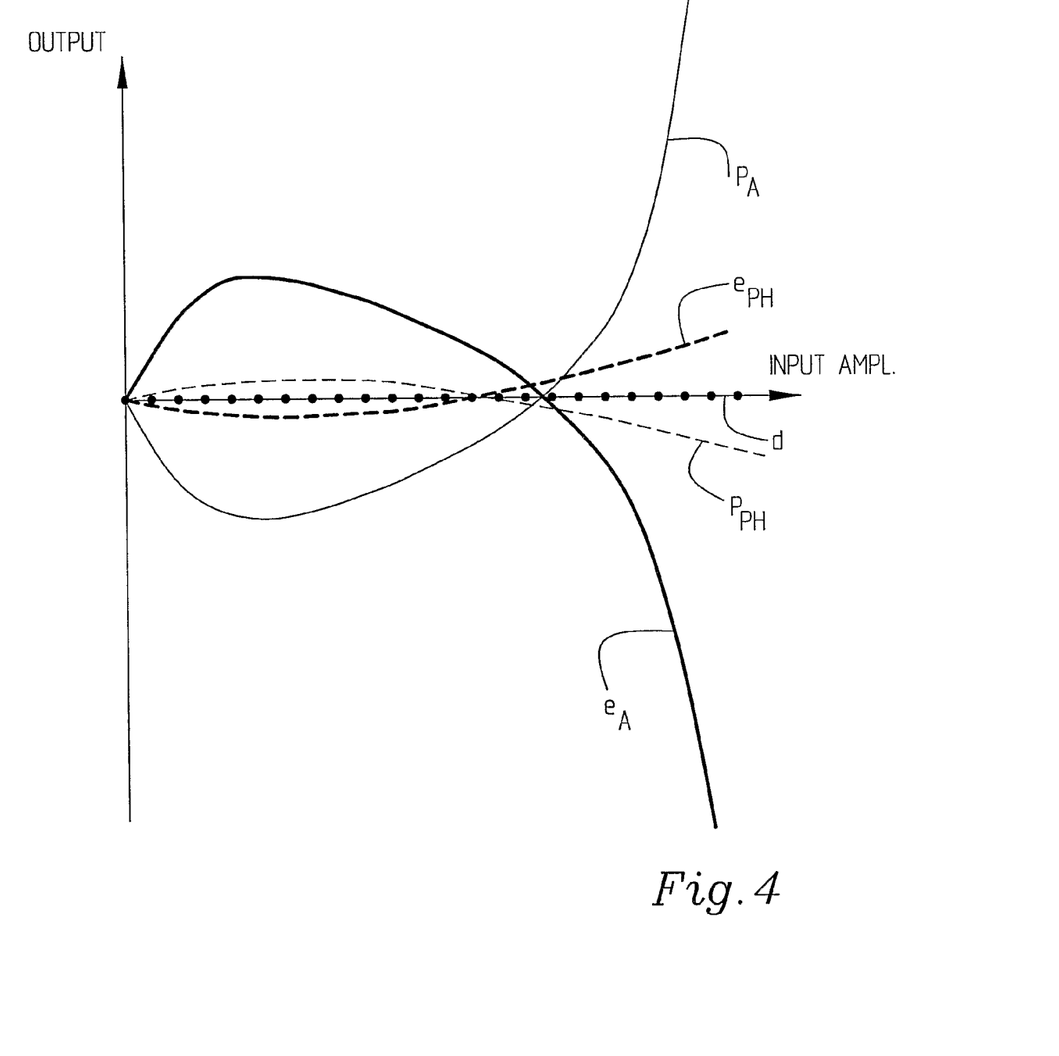
FIG. 4 is a diagram showing an example of how a non-linear power amplifier may affect an input signal and how controlled predistortion according to the present invention can correct the signal.

FIG. 4 is a diagram very schematically illustrating one example of how a non-linear power amplifier may behave and affect an input signal with an input amplitude and an input phase according to the AM/AM, AM/PM model, i.e. the output amplitude as well as the output phase is given or can be obtained if the input amplitude is known. The figure furthermore illustrates how the predistortion according to the present invention may eliminate or reduce these effects, or the behaviour of the non-linear power amplifier, by applying correction values, i.e. distortion coefficients on the input signal to be amplified. The LUTs of the look-up table arrangement are updated to contain the correction values, in any format as may be convenient for the specific implementation. According to the present invention the correction values, obtained from the updated, adjusted detected error signal, are distributed in at least two LUTs.

In FIG. 4, for an input amplitude, curve $e_A$ indicates a possible amplitude error in [dB] as a function of the input amplitude, i.e. it is an AM/AM plot. The curve $e_{pH}$ correspondingly illustrates the phase error as a function of input amplitude, i.e. it is an AM/PM plot. d illustrates the ideal or desired phase amplitude error. PA shows an example of a predistortion amplitude correction curve in [dB], whereas $p_{PH}$ schematically illustrates an example of a phase correction predistortion according to the present invention.

Figure 5:
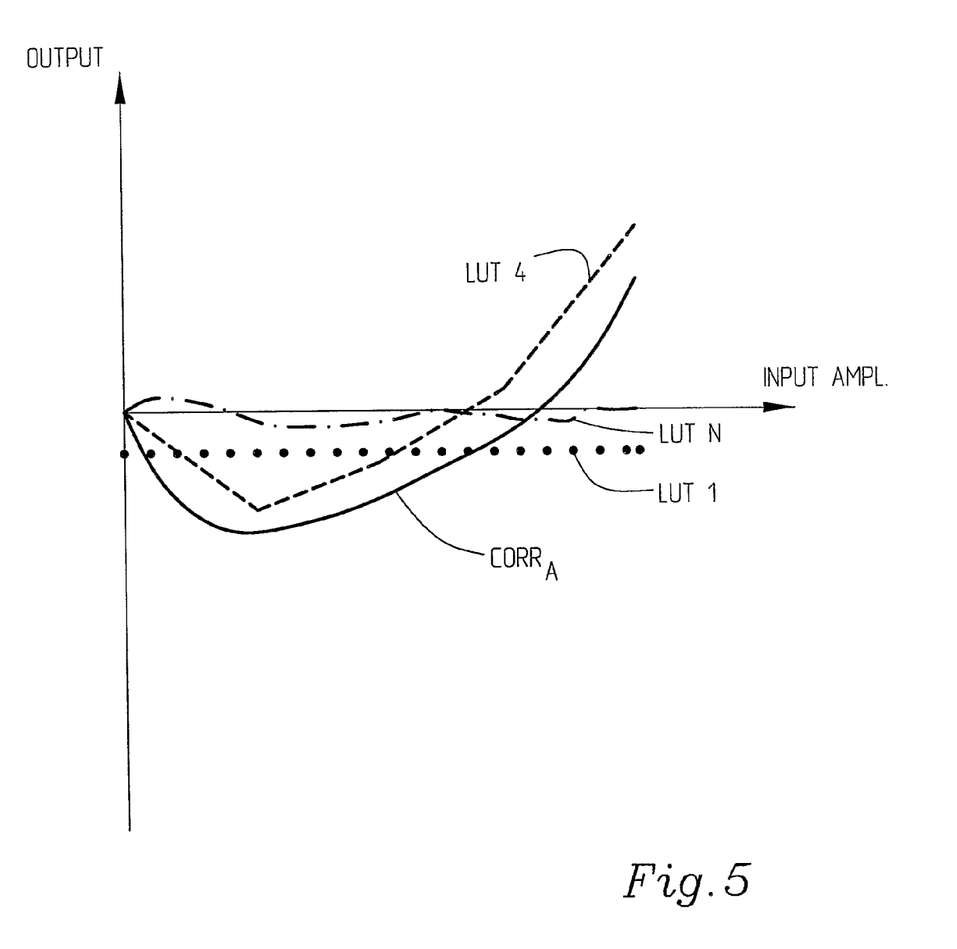
FIG. 5 is a diagram illustrating an example of distribution of correction values in three hierarchical look-up tables.

In FIG. 5 an example of correction values of a hierarchical LUT arrangement according to the present invention comprising three LUTs, one with one bin only, (i.e. enabling one table entry), LUT 1 in the figure, LUT 4 linearly interpolated with four bins (i.e. allowing four entries) and LUT N with a comparatively large number of bins, for example 128 as in the embodiment shown in FIG. 3. The curve $CORR_A$ illustrates the effective predistortion amplitude correction in [dB] with correction values distributed in the three LUTs as schematically illustrated in FIG. 5 (only AM/AM illustrated). It should be clear that this figure merely is included for illustrative and explaining purposes and schematically indicates the function and behaviour of an arrangement according to the present invention.

Figure 6:
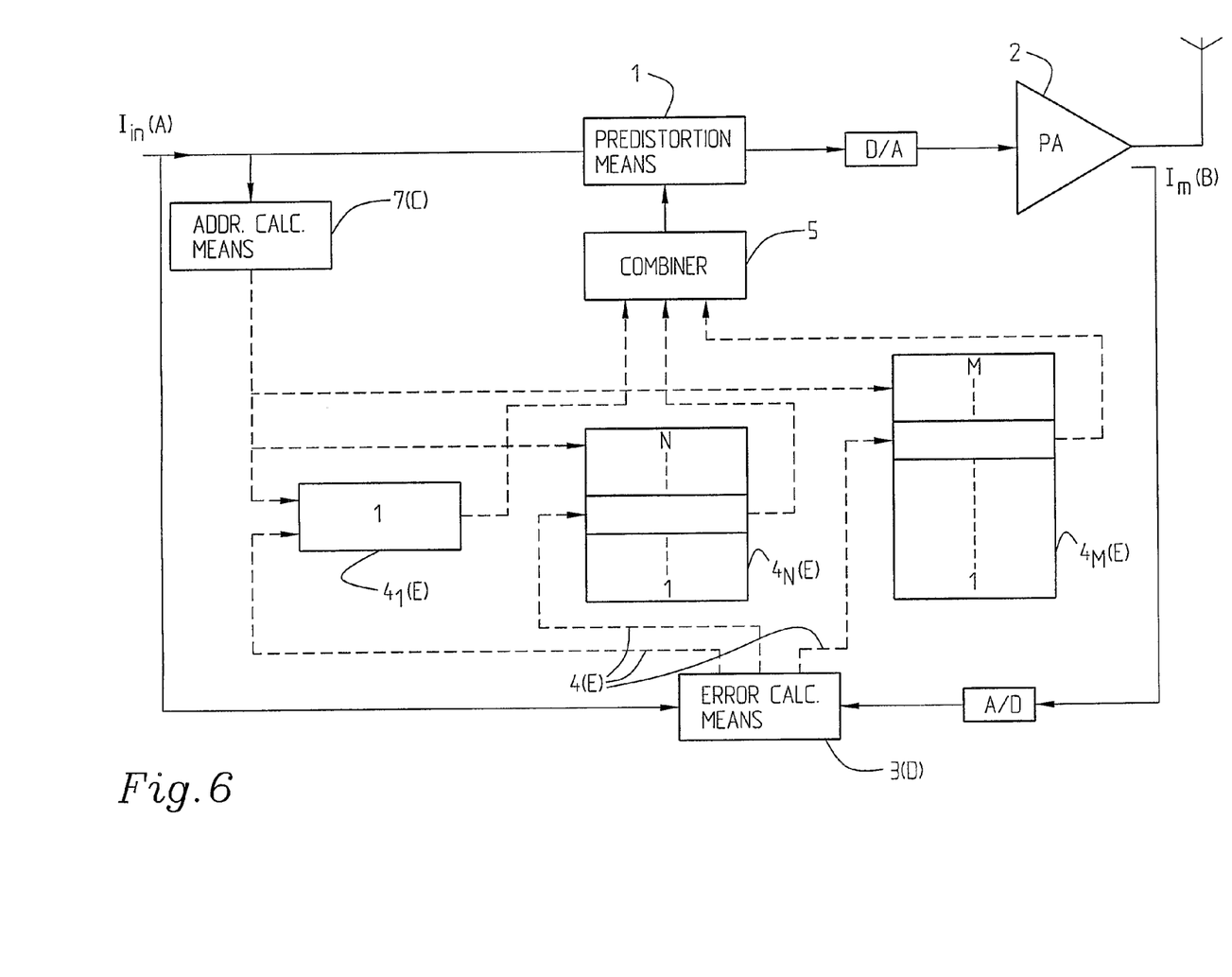
FIG. 6 is a block diagram of an arrangement according to the invention in which the look-up table updating flow is schematically indicated.

FIG. 6 is a block diagram schematically illustrating an embodiment of the inventive arrangement with reference to which it is intended to explain the LUT table updating flow. The block diagram generally shows an arrangement as in FIG. 2 comprising a predistortion means 1, a D/A converter and a non-linear power amplifier PA 2 on the output of which a monitoring signal $I_m$ is extracted and subsequently converted in A/D converter.

The estimation means are here denoted means for calculation of the error 3 which is used for updating the look-up table arrangement, here comprising a first look-up table $4_1$ comprising one bin, a second look-up table $4_N$ with N bins and a third look-up table $4_M$ with M bins. The block diagram also contains a combiner 5 for combining the values obtained from the look-up tables to provide a predistortion coefficient and for input of the predistortion coefficient to the predistortion means 1. Address calculating means 7 are also illustrated for calculation of an amplitude address from the input signal $I_{in}$.

The updating flow will now be described with reference to the capital letters included in parentheses in the block diagram.

Thus, it is supposed that first an input signal $I_{in}$ is provided, A. The signal is provided to the predistortion arrangement 1 where it is predistorted, subsequently D/A-converted and amplified in the PA 2. Subsequently a monitoring or a feedback signal $I_m$ is extracted, B, and it is used to monitor the output of the PA 2. The signal $I_m$ is converted in an A/D converter from where it is input to the estimation means, here denoted error calculation means 3. In parallel with the procedure of predistorting the input signal $I_{in}$ etc., the signal $I_n$ is also input to means for address calculation 7, where an amplitude address is calculated, C. The input signal $I_{in}$ is also, after properly delaying in delay means (time aligning with $I_m$) (not shown in this figure), input to the error calculation means 3, D. In the error calculation means 3, also denoted error estimation means, the difference between $I_m$ and $I_{in}$ (time aligned) is calculated (for corresponding samples) and the result appropriately scaled with adjustment factors and as explained above, D. Subsequently, using the address calculated in the address calculating means 7, in step C, the hierarchical LUT tables $4_1$, $4_N$, $4_M$ are updated (i.e. the respective relevant table entries of each LUT) with the result obtained in step D using the addresses as established in step C.

Figure 7:
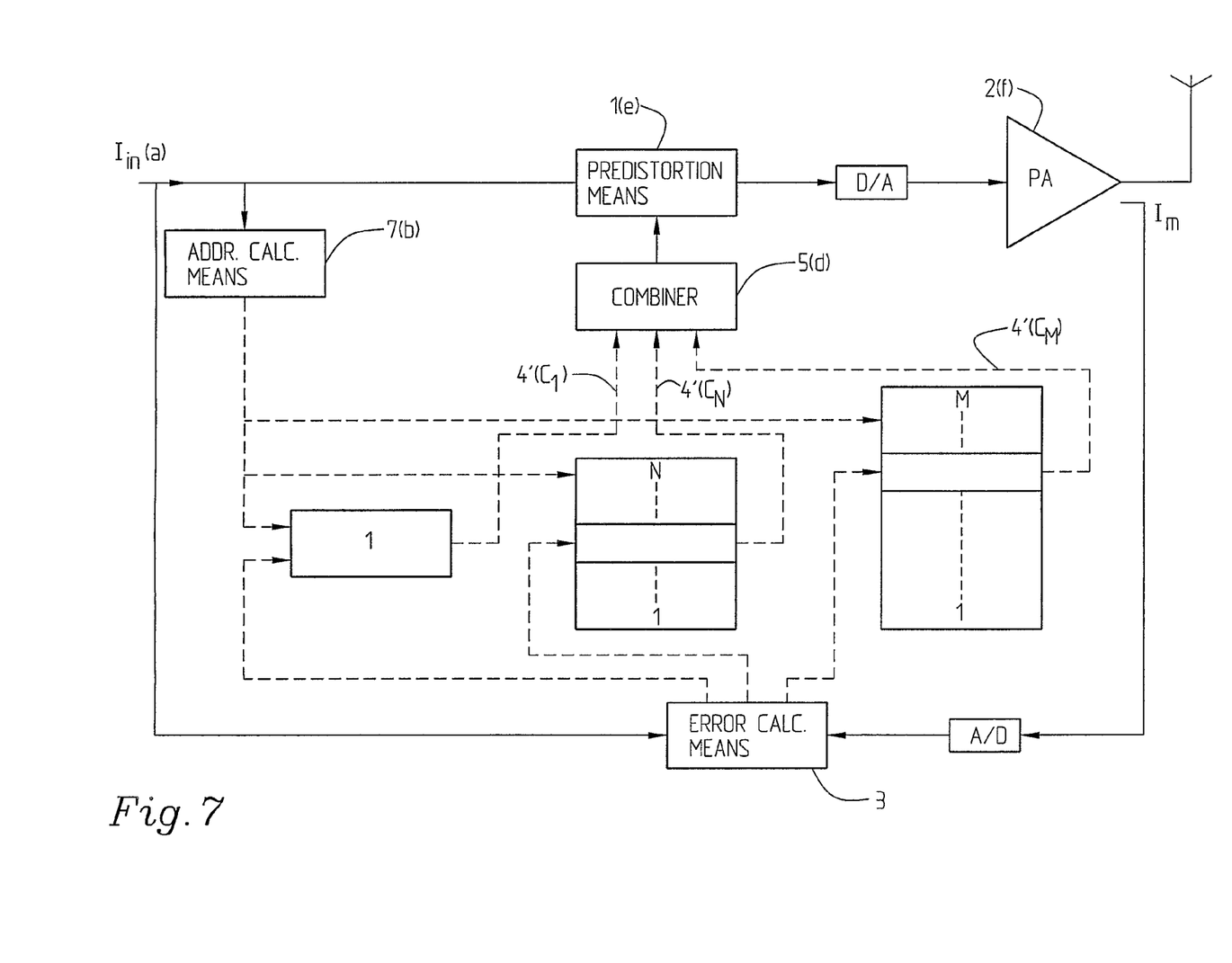
FIG. 7 shows the same block diagram as FIG. 6 in which the flow for application of the combined, (composite) value comprising the distortion factor to the digital predistortion arrangement is indicated.

In the flow describing the flow for application of the predistortion according to FIG. 6 obtained updated values is described with reference to the block diagram of FIG. 7, which corresponds to that of FIG. 6 and for the same means, the same reference numbers are used but the steps leading to the application of the predistortion coefficient to the predistortion arrangement 1 are denoted with small letters. Thus, the input signal $I_{in}$ is input (a) to the predistortion arrangement 1, to the error calculation means 3 and to the address calculation means 7. In the address calculation means 7 an amplitude address is calculated from the input signal, b. The correction values or the updated predistortion values from the hierarchical LUT tables obtained using the address calculated in step b are provided to the combiner 5, 4'($C_1$), 4'($C_N$), 4'($C_M$). Subsequently these predistortion values are combined in combiner 5, d, using a normal multiplication operation for multiplying the values or alternatively an addition operation for adding the values. Subsequently the combined signal obtained in step d is applied to the input signal $I_{in}$ in the predistorting means, e. The predistorted signal as obtained in step e is then converted in D/A-converter and input to the power amplifier PA, where it is amplified, f, and a linearized output signal is provided to antenna means, f. (Again a monitoring signal is of course extracted from the output signal and fed back to the estimation means or the error calculation means 3 etc. for the subsequent samples of the input and monitoring signal respectively, and the procedure is repeated.)

Figure 8:
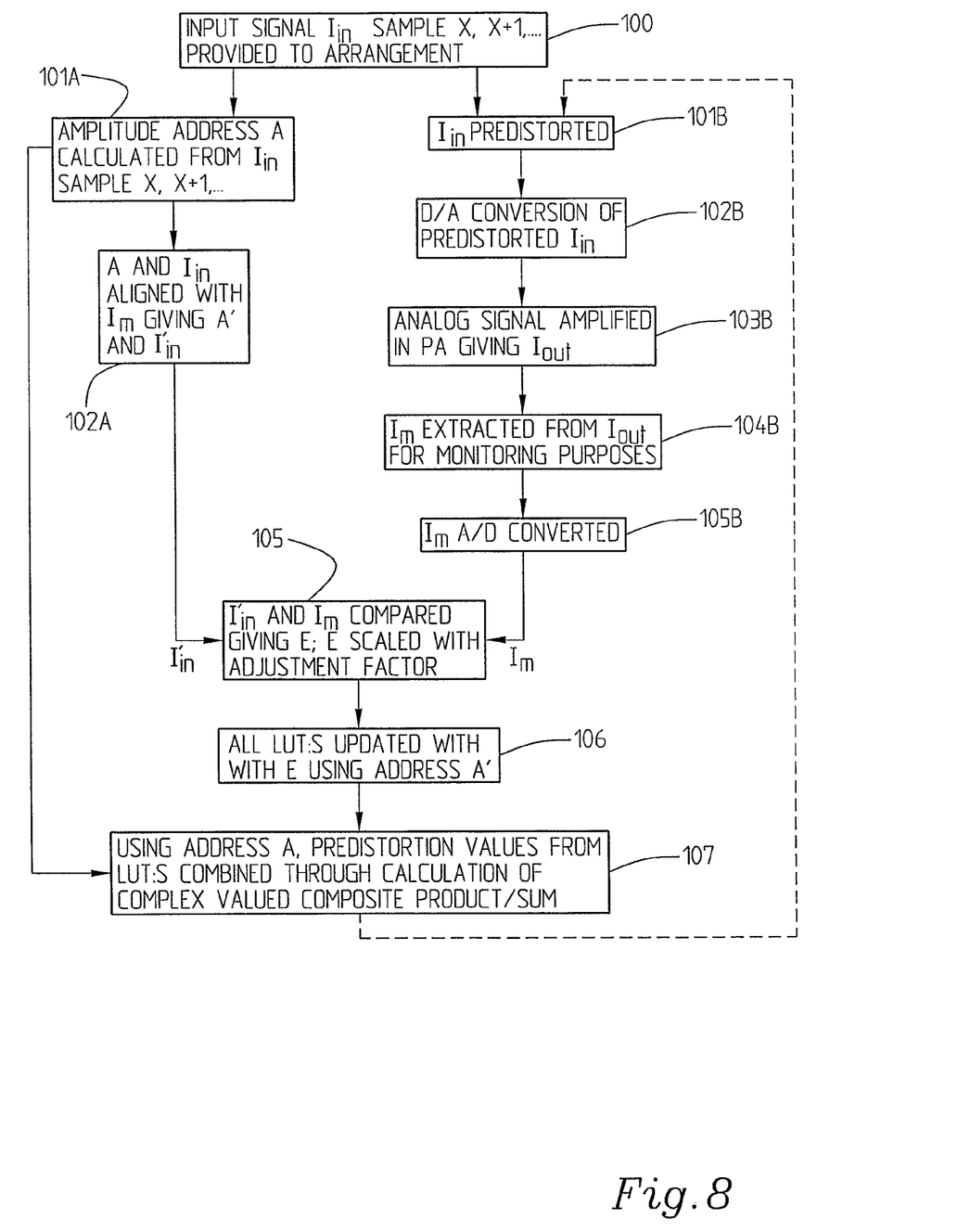
FIG. 8 is a schematical flow diagram illustrating the procedure for predistorting an input signal according to the inventive concept.

FIG. 8 is a schematical flow diagram describing the general flow according to one embodiment of the present invention. Thus, it is supposed that an input signal $I_{in}$, samples x, x+1, ..., is provided to an arrangement which here is supposed to include a non-linear power amplifier, 100. As referred to earlier the power amplifier may be included in the arrangement or a conventional amplifier can be used. As also discussed earlier in the application, an amplitude address A (particularly the highest amplitude address in the LUT having the highest number of entries) is calculated from $I_{in}$, 101A. The amplitude address may be calculated in different ways. In one embodiment, for each sample, the absolute value of $I_n$ (x) ... is taken to give an address A. Subsequently the obtained address is scaled for each table such that table specific addresses are obtained. $I_{in}$ and the calculated address are then delayed, i.e. time aligned with $I_m$ (which is the monitoring signal extracted from $I_{out}$), 102A. This gives what here is denoted A' and I'$_{in}$ which thus indicate the time aligned (with $I_m$) sample of $I_{in}$ and the time aligned address. In parallel herewith the input signal $I_{in}$ is provided to a predistortion arrangement where it is predistorted, 101B. As can be seen, the calculated amplitude address A is used for that purpose. The predistorted input signal is then converted in a D/A-converter, 102B and the analog signal is amplified in the power amplifier PA giving an output signal $I_{out}$, 103B. Subsequently, as referred to above, a monitoring signal or a feedback signal $I_m$ is extracted from $I_{out}$ for monitoring purposes, 104B, which subsequently is converted to a digital signal, 105B.

The time aligned sample of the input signal $I_{in}$ and the corresponding fed back sample of $I_m$ are then compared in error estimation means, or error calculation means, giving an error E, which is scaled with an appropriate adjustment factor, 105. Using the time aligned amplitude address A' as calculated in step 101A, all LUTs (i.e. the corresponding relevant table entries as explained earlier in the application are updated with a scaled error E, 106). Using the calculated (not time aligned) address A the predistortion values from the LUTs are combined through calculation of a complex valued composite product or sum, 107 as described in a more detailed manner earlier in the application. The composite product/sum is applied to the predistortion means to control the predistortion of the signal $I_n$, 101B, which is amplified after D/A conversion, 102B, in the non-linear PA, 103B etc. Again, in the next step, a monitoring signal is extracted, 104B and the procedure is repeated for the next corresponding samples from $I_{in}$ and $I_m$.

It should be clear that the invention is not limited to the specific illustrated embodiments but that it can be varied in a number of ways within the scope of the appended claims.

The invention claimed is:

1. A predistortion signal amplifier arrangement comprising digital predistortion means for predistortion of an input signal, a non-linear power amplifier, a predistortion control arrangement comprising error estimation means for estimating the error produced in the predistorted signal and a predistortion look-up table arrangement, the content in which is updated by the estimation means,
characterized in that the predistortion look-up table arrangement comprises at least two look-up tables, which are updated by said estimation means, that said at least two look-up tables have different number of table entries, and in that it further comprises a combiner for combining updated values obtained from said at least two look-up tables into a composite value and in that said composite value comprises a distortion coefficient which is input to said digital predistortion arrangement for signal predistortion.

2. A predistortion signal amplifier arrangement according to claim 1, characterized in that the estimation means comprises an adaptive estimation algorithm and in that a single estimation process is used for updating all look-up tables.

3. A predistortion signal amplifier arrangement according to claim 2, characterized in that all of said at least two look-up tables are updated concurrently.

4. A predistortion signal amplifier arrangement according to claim 2, characterized in that all of said look-up tables are accessed substantially simultaneously, i.e. the estimated error value, for each iteration, which is input substantially simultaneously to the appropriate calculated amplitude addresses in the look-up tables to update the entries with said respective addresses in the respective look-up tables.

5. A predistortion signal amplifier arrangement according to claim 4, characterized in that the estimation means calculates the difference between the input signal and the predistorted signal amplitudes of the preceding iteration step.

6. A predistortion signal amplifier arrangement according to claim 5, characterized in that address calculating means are provided for calculating the amplitude addresses for the input signal, one address for each look-up table, said amplitude addresses with the corresponding estimated error value being provided to each look-up table.

7. A predistortion signal amplifier arrangement according to claim 1, characterized in that, for each iteration step of a number of steps for controlling the predistortion one, or more error estimates are provided by the estimation means, and in that for each error estimation a corresponding look-up table entry amplitude address is calculated.

8. A predistortion signal amplifier arrangement according to claim 6, characterized in that the calculated amplitude address is the look-up table with the largest number of table entries.

9. A predistortion signal amplifier arrangement according to claim 1, characterized in that the look-up tables are hierarchical.

10. A predistortion signal amplifier arrangement according to claim 1, characterized in that the look-up table with the lowest number of table entries comprises one table entry.

11. A predistortion signal amplifier arrangement according to claim 1, characterized in that the predistortion control arrangement comprises two, three or four look-up tables.

12. A predistortion signal amplifier arrangement according to claim 1, characterized in that the predistortion control arrangement comprises more than four look-up tables.

13. A predistortion signal amplifier arrangement according to claim 11, characterized in
that the predistortion control arrangement comprises three lookup tables, of which a first comprises one table entry, a second comprises four table entries and the third comprises 128 table entries.

14. A predistortion signal amplifier arrangement according to claim 1, characterized in that the composite value constituting the predistortion coefficient comprises a complex valued composite product/sum in polar coordinates.

15. A predistortion signal amplifier arrangement according to claim 1, characterized in that the composite value constituting the distortion coefficient comprises a complex valued composite product/sum in Cartesian coordinates.

16. A predistortion signal amplifier arrangement according to claim 14, characterized in that the composite distortion coefficient $C_{composite}$ is calculated as the product or the sum of all the updated look-up table entries appropriately time aligned obtained from the tables using calculated amplitude addresses, $C_{composite} = \pi LUT_n(A_n)$ wherein $A_n$=round $(A \times A_{max,n}/A_{max})$ or $\Sigma LUT_n(A_n)$ wherein $A_n$=round $(A \times A_{max,n}/A_{max})$ for n=1, N; N being the number of lookup tables.

17. A predistortion signal amplifier arrangement according to claim 1, characterized in that each updated table entry comprises the corresponding estimated error adjusted by a table specific, or particularly table entry specific, feed-back gain factor (or adjustment factor) $(k_n(A_n))$, $A_n$=round $(A \times A_{max,n}/A_{max})$; n=1, ...,N.

18. A predistortion signal amplifier arrangement according to claim 17, characterized in that the adjustment factor in addition depends on the table entry address.

19. An digital predistortion arrangement, for predistortion of an input signal, comprising digital predistortion means, a predistortion control arrangement comprising error estimation means for estimating the error produced in the predistorted signal and a predistortion look-up table arrangement, the content of which is updated by the estimation means, characterized in that the predistortion look-up table arrangement comprises at least two look-up tables, that said at least two look-up tables have different number of table entries, and in that it further comprises a combiner for combining the updated values obtained from said at least two look-up tables for a calculated amplitude address of the input signal for each look-up table, into a composite value and in that said composite value comprises a distortion coefficient which is input to said digital predistortion arrangement for signal predistortion.

20. A digital predistortion arrangement according to claim 19, characterized in that the estimation means comprises an adaptive estimation algorithm and in that a single estimation process is used for updating all look-up tables.

21. A digital predistortion arrangement according to claim 20, characterized in that all of said at least two look-up tables are updated concurrently.

22. A digital predistortion arrangement according to claim 21, characterized in that all of said look-up tables are accessed substantially simultaneously, i.e. the estimated error value, for each iteration, which is input substantially simultaneously to the appropriate calculated amplitude addresses in the look-up tables to update the entries with the respective addresses in the respective tables, that the estimation means calculates the difference between the input signal amplitude and the predistorted signal amplitude of the preceding iteration step, and in that address calculating means are provided for calculating the amplitude addresses for the input signals.

23. A digital predistortion arrangement according to claim 19, characterized in that the predistortion control arrangement comprises three lookup tables, of which a first comprises one table entry, a second comprises four table entries and the third comprises 128 table entries.

24. A digital predistortion arrangement according to claim 19, characterized in that the composite value constituting the distortion coefficient comprises a complex valued composite product/sum in polar coordinates or in Cartesian coordinates.

25. A digital predistortion arrangement according to claim 24, characterized in that the composite distortion coefficient $C_{composite}$ is calculated as the product or sum of all the updated look-up tables entries, appropriately time aligned and obtained using calculated amplitude addresses $A_{n=round\ (A \times A max,n}/A_{max})$, $C_{composite} = \pi LUT_n(A_n)$ or $\Sigma LUT_n(A_n)$ for n =1, ..., N; N being the number of look-up tables.

26. Use of an arrangement as in claim 1, in a radio base station in a communication system.

27. A method for predistortion of an input signal, to be amplified in a non-linear power amplifier, comprising the steps of:
using a feed-back signal from the amplified signal, and the input signal to provide an error estimate, characterized in that it further comprises the steps of:
updating one table entry in each of at least two different look-up tables by providing an adjusted error estimate to a corresponding amplitude address of an entry in a look-up table to said at least two look-up tables with a different number of table entries,
combining the updated table entries of said at least two look-up tables to provide a composite distortion coefficient,
applying the obtained distortion coefficient to the input signal for predistortion,
providing the predistorted signal to the power amplifier.

28. A method according to claim 27, characterized in that the error estimation step comprises the steps of implementing an adaptive estimation algorithm.

29. A method according to claim 28, characterized in that the updating step comprises the steps of:
calculating an amplitude address using the input signal,
calculating the difference between the input signal and the feedback signal and scaling or adjusting the result for the calculated amplitude address in the respective look-up tables with a scaling or adjustment factor coefficient which at least is specific for the respective look-up table;
updating, using the calculated amplitude addresses, the look-up tables using the appropriate scaled or adjusted difference estimated error signals.

30. A method according to claim 27, characterized in that the steps for combining the updated table entries comprises the steps of:
reading out the respective updated scaled or adjusted difference signals or predistortion values, from the look-up tables with a corresponding amplitude address calculated from the input signal,
combining all the read out predistortion values.

31. A method according to claim 27, characterized in that the updating step is performed, for each look-up table n, n=1, ..., N by performing a normalizing operation comprising multiplying the calculated address A with the highest address of the respective look-up table n divided by the highest address of the largest look-up table and subtracting, from the hence obtained product, a table specific, or particularly table entry specific, error feed-back gain factor or adjustment factor kn(An) multiplied with the estimated error E; updated $LUT_n(A_n) = LUT_{n(An)} - k_n(A_n) \times E$.

32. A method according to claim 27, characterized in that the combining step comprises:
calculating a complex valued composite product and/or sum in polar or cartesian coordinates by, multiplying/adding as follows: $\pi LUT_n(A_n)$ or $\Sigma LUT_n(A_n)$ wherein $A_n = (\text{round}(A \times A_{max,n}/A_{max}))$, $n=1,\ldots,N$.

* * * * *

UNITED STATES PATENT AND TRADEMARK OFFICE
CERTIFICATE OF CORRECTION

PATENT NO. : 7,535,298 B2 Page 1 of 1
APPLICATION NO. : 11/575174
DATED : May 19, 2009
INVENTOR(S) : Sihlbom et al.

It is certified that error appears in the above-identified patent and that said Letters Patent is hereby corrected as shown below:

In Column 5, Line 24, delete "$\rho LUT_n(A_n)$" and insert -- $\Sigma LUT_n(A_n)$ --, therefor.

In Column 6, Line 37, after "$(A \times A_{max,n}/A_{max})$" insert -- , --.

In Column 7, Line 61, delete "$e_{pH}$" and insert -- $e_{PH}$ --, therefor.

In Column 7, Line 64, delete "PA" and insert -- $P_A$ --, therefor.

In Column 12, Line 15, in Claim 25, delete "$A_{n=round\ (A \times Amax,n/A_{max})}$," and insert -- $A_n$=round $(A \times A_{max,n}/A_{max})$, --, therefor.

In Column 12, Line 67, in Claim 31, delete "$LUT_{n(An)}$" and insert -- $LUT_n(A_n)$ --, therefor.

Signed and Sealed this

Tenth Day of November, 2009

David J. Kappos
*Director of the United States Patent and Trademark Office*